US010276302B2

(12) United States Patent
Ravelosona (10) Patent No.: US 10,276,302 B2
(45) Date of Patent: Apr. 30, 2019

(54) PROCESS FOR TREATING A MAGNETIC STRUCTURE

(71) Applicants: Centre National De La Recherche Scientifique—CNRS, Paris (FR); Universite Paris Sud (Paris 11), Orsay (FR)

(72) Inventor: Dafine Ravelosona, Villiers le Bacle (FR)

(73) Assignees: Centre National de la Recherche Scientifique (CNRS), Paris (FR); Universite Paris SUD (Paris II), Orsay (FR)

( * ) Notice: Subject to any disclaimer, the term of this patent is extended or adjusted under 35 U.S.C. 154(b) by 529 days.

(21) Appl. No.: 14/769,760

(22) PCT Filed: Feb. 21, 2014

(86) PCT No.: PCT/FR2014/050366
§ 371 (c)(1),
(2) Date: Aug. 21, 2015

(87) PCT Pub. No.: WO2014/131969
PCT Pub. Date: Sep. 4, 2014

(65) Prior Publication Data
US 2016/0005537 A1  Jan. 7, 2016

(30) Foreign Application Priority Data
Feb. 27, 2013  (FR) .................................. 13 51739

(51) Int. Cl.
*H01F 41/02*  (2006.01)
*H01F 1/047*  (2006.01)
(Continued)

(52) U.S. Cl.
CPC ......... *H01F 41/0253* (2013.01); *H01F 1/047* (2013.01); *H01F 7/02* (2013.01); *H01F 41/308* (2013.01); *H01L 43/12* (2013.01)

(58) Field of Classification Search
None
See application file for complete search history.

(56) References Cited

U.S. PATENT DOCUMENTS 6,605,321 B1 *  8/2003  Ravelosona-Ramasitera ............. C23C 14/58  117/4
8,337,637 B2 *  12/2012  Yuan ........................ C23C 8/02  148/105

(Continued)

FOREIGN PATENT DOCUMENTS

CN  101345286 A  1/2009

OTHER PUBLICATIONS

International Search Report Application No. PCT/FR2014/050366 report dated Sep. 5, 2014.
(Continued)

*Primary Examiner* — Xiaowei Su
(74) *Attorney, Agent, or Firm* — Miller, Matthias & Hull LLP (57) ABSTRACT

Process for treating a magnetic structure, wherein it comprises the following steps: providing a magnetic structure comprising one first layer of magnetic material comprising a CoFeB alloy; irradiating the magnetic structure with light low-energy ions; and simultaneously holding the magnetic structure with a preset temperature profile and for a preset time.

11 Claims, 8 Drawing Sheets (51) Int. Cl.
  *H01F 7/02* (2006.01)
  *H01L 43/12* (2006.01)
  *H01F 41/30* (2006.01)

(56) References Cited

U.S. PATENT DOCUMENTS

| | | | |
|---|---|---|---|
| 2005/0244679 A1* | 11/2005 | Arai | G11B 5/667 |
| | | | 428/828 |
| 2009/0237838 A1* | 9/2009 | Fukushima | G11B 5/855 |
| | | | 360/110 |
| 2011/0096443 A1 | 4/2011 | Zhang et al. | |
| 2012/0244640 A1 | 9/2012 | Ohsawa et al. | |

OTHER PUBLICATIONS

Kraposhin, et al; Crystallization of Co-based amorphous alloys under the impact of the ion irradiation and recovery to the amorphous phase; Journal of Non-Crystalline Solids, North-Holland Physics Publishing; Amsterdam, NL; vol. 353, No. 32-40; Sep. 15, 2007.

* cited by examiner

PROCESS FOR TREATING A MAGNETIC STRUCTURE

CROSS-REFERENCE TO RELATED APPLICATION

This application is a 35 USC § 371 U.S. national stage filing of International Patent Application No. PCT/FR2014/050366 filed on Feb. 21, 2014, which claims priority under the Paris Convention and 35 USC § 119 to French Patent Application No. 13 51739, filed on Feb. 27, 2013.

FIELD OF THE DISCLOSURE

The present invention relates to a process for treating a magnetic structure, intended in particular for digital storage to be used for example in MRAM (Magnetic Random Access Memory).

BACKGROUND OF THE DISCLOSURE

Given the considerable increase in the total volume of digital data generated worldwide (2.7 zettabits in 2012), it is essential that the storage density (storage capacity per unit area) of non-volatile mass storage continues to increase. This increase must help rein back the proliferation of storage media, while meeting the compactness requirements of mobile applications and reducing the energy footprint.

The market for non-volatile mass storage is currently divided between hard disks (for computers and data centers) and flash memories for mobile applications (smartphones, ultraportables, etc.). Although the performance of these two technologies has advanced significantly in recent years, they will encounter major technological barriers by 2015 in terms of density as well as access speed and stability over time.

New concepts of non-volatile MRAM (STT-MRAM, Race Track Memory, TAS-MRAM, etc.) are therefore under development as competitors against flash memory as well as DRAM and SRAM.

However, these new technologies are hampered by technological barriers related to the magnetic materials used.

Such memory is based on magnetic materials which are synthesized at ambient temperature in amorphous form and then annealed at high temperature (300° C. for 1 to 2 hours) to obtain a crystalline phase having the required properties, particularly a high magnetic anisotropy and a strong magnetoresistance signal.

However, these high temperatures can degrade the properties of the material, which after thermal annealing will generally have more structural defects responsible for less uniformity in the magnetic properties.

In addition, these high temperatures mean a significant energy expenditure, which is undesirable in processes executed on an industrial scale.

SUMMARY OF THE DISCLOSURE

The present invention aims to overcome these disadvantages by proposing a process that obtains magnetic materials of better quality but in a manner suitable for industrial-scale production.

To this end, the invention relates to a process for treating a magnetic structure, characterized in that it comprises the following steps:
  providing a magnetic structure comprising at least one first layer of magnetic material comprising a CoFeB alloy;
  irradiating the magnetic structure with low-energy light ions; and
  simultaneously holding the magnetic structure at a preset temperature profile and for a preset time.

By coupling the heating/ion irradiation, the temperatures and synthesis times for the magnetic materials can be greatly decreased, reducing the thermal budget and improving the quality of the materials obtained.

In various embodiments of the process according to the invention, one or more of the following arrangements may optionally be used:
  the preset temperature is less than or equal to 200° C.;
  the preset temperature is between 20° C. and 200° C.;
  the preset temperature is between 15° C. and 40° C.;
  the preset time is less than or equal to 1 hour;
  the magnetic material is initially amorphous;
  the magnetic material is initially crystalline;
  the ions are $He^+$, $H^+$, $Ar^+$, $Xe^+$, or $Ga^+$ ions;
  the ions have an energy of between 0.1 keV and 150 keV;
  during the irradiation step, the ions are emitted at a dose of between $1*10^{13}$ ions/cm$^2$ and $5*10^{16}$ ions/cm$^2$;
  during the irradiation step, the ions pass through at least the first layer of magnetic material;
  during the irradiation step, the ions bombard the magnetic structure via through-openings in a mask;
  the magnetic structure comprises at least one second layer of insulation in contact with the first layer of magnetic material; and
  the magnetic structure comprises a stack of alternating first layers of magnetic material and second layers of insulation.

The invention also relates to a magnetic structure, characterized in that it comprises at least:
  a first layer of magnetic material comprising a CoFeB alloy; and
  a substrate on which is arranged the first layer of magnetic material and comprising low-energy light atoms.

In particular, the magnetic structure may have an effective anisotropy field that is greater than or equal to 500 mT.

BRIEF DISCRIPTION OF THE DRAWINGS

The invention will be better understood by reading the following description of various embodiments of the invention, given by way of example only, with reference to the accompanying drawings in which.

In the various figures, the same references designate identical or similar elements.

DETAILED DESCRIPTION OF THE DISCLOSURE

Figure 1:
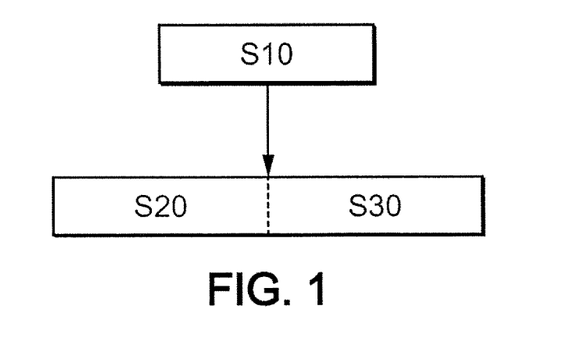
FIG. 1 is a diagram representing the various steps of a process for treating a magnetic structure according to the invention.

FIG. 1 illustrates the various steps of a process for treating a magnetic structure according to the invention.

A first step S10 of this process comprises the providing of a magnetic structure 100.

Figure 2:
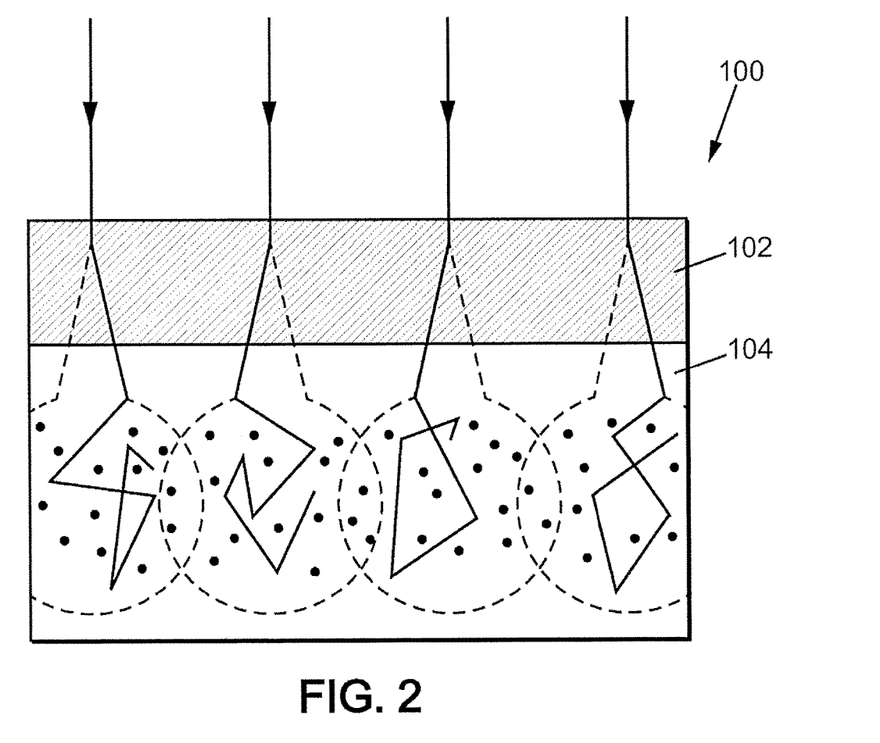
FIG. 2 is a sectional view of a magnetic structure according to the invention.

Referring to FIG. 2, the magnetic structure 100 comprises a first layer 102 fabricated from a magnetic material comprising a CoFeB alloy.

The magnetic structure 100 further comprises a substrate 104 on which the magnetic layer 102 is arranged.

The magnetic structure 100 may also comprise a "buffer" layer 101 such as a film of Ta deposited between the substrate 104 and the magnetic stack 102 and encouraging a specific crystalline structure for the magnetic layer and an interface anisotropy.

Figure 3:
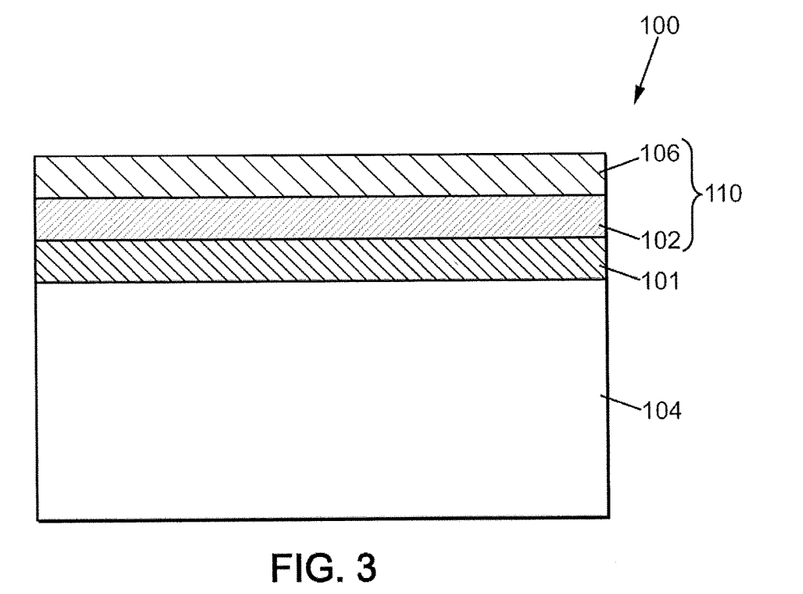
FIGS. 3, 4, and 5 are sectional views illustrating variations of the magnetic structure of FIG. 2.

In a first variant illustrated in FIG. 3, the magnetic structure 100 is a multilayer structure comprising, in addition to the magnetic layer 102 deposited on the buffer layer 101, a second layer 106 fabricated of an insulating material and deposited on the magnetic layer 102.

Figure 4:
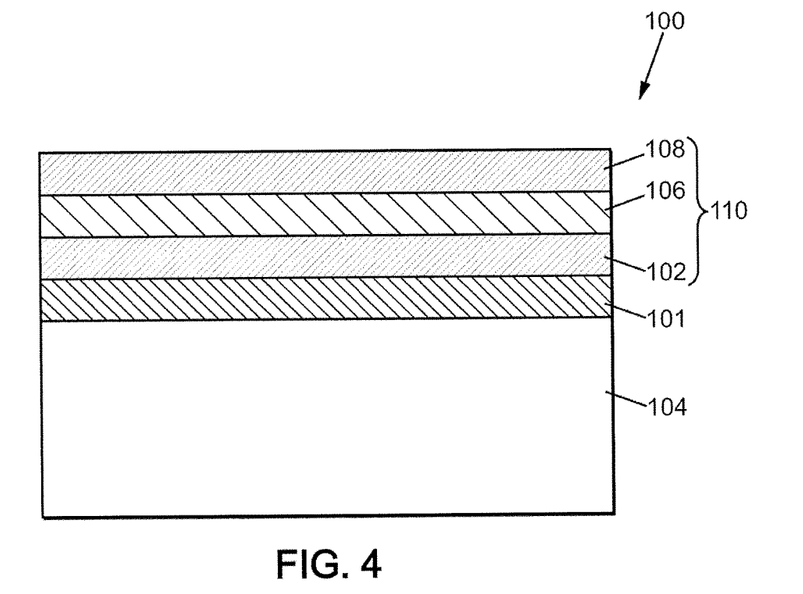

In a second variant illustrated in FIG. 4, the magnetic structure 100 is a multilayer structure comprising, in addition to the magnetic layer 102 deposited on the buffer layer 101 and insulating layer 106, a third layer 108 fabricated from a magnetic material comprising a CoFeB alloy and deposited on the insulating layer.

The magnetic layers 102 and 108 are identical to each other. Alternatively, the magnetic layers 102 and 108 may be different from each other. In the following, the various magnetic layers containing CoFeB alloy will generally be referred to as "type 102" layers.

The insulating layer 106 comprises MgO. Alternatively, the insulating layer 106 may have a different composition. In general, an insulating layer included in a magnetic stack will be referred to below as "type 106" regardless of its composition.

As the buffer layer 101 is optional, it is not further represented in order to simplify the figures.

Figure 5:
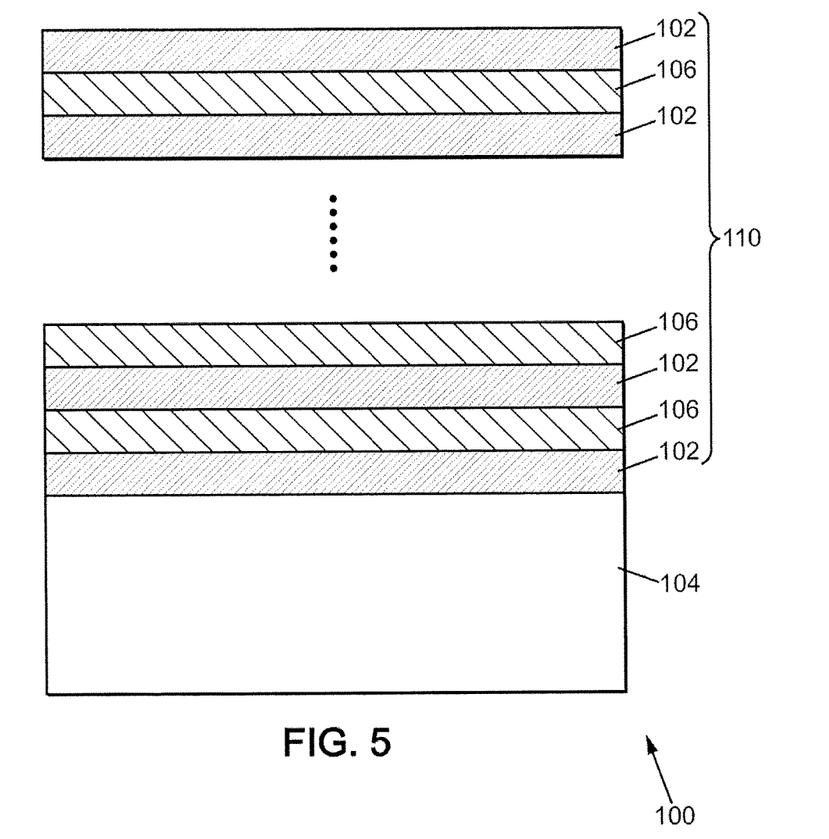

In a third variant illustrated in FIG. 5, the magnetic structure 100 is a multilayer structure comprising an alternating succession of layers of type 102 and layers of type 106, this stack of layers being deposited directly on the substrate 104. The stack of magnetic and insulating layers is denoted 110.

Note that the type 102 layers may themselves comprise a stack of magnetic layers containing layers of CoFeB alloy combined with layers of other magnetic materials.

In addition, the magnetic structure 100 may also be covered by a layer called the capping layer, in order to reduce oxidation of the magnetic structure.

The type 102 magnetic layers and type 106 insulating layers described above lie substantially parallel to one another.

The type 102 magnetic layers have a thickness between 0.1 nm and 3 nm.

The CoFeB alloy contained in the type 102 magnetic layers comprises for example about 20% cobalt, 60% iron, and 20% boron. In one variant, the CoFeb alloy contained in the type 102 magnetic layers may comprise for example about 40% cobalt, 40% iron, and 20% boron. In another variant, the CoFeB alloy may comprise for example about 60% cobalt, 20% iron, and 20% boron.

The type 106 insulating layers have a thickness between 0.1 nm and 3 nm.

The substrate 104 has a thickness of several hundred micrometers. The substrate 104 may be any substrate comprising for example $SiO_2$, SIN, or a CMOS wafer.

The providing step S10 is followed by a step S20 of irradiating the magnetic structure 100 and a step S30 of heating the magnetic structure 100 (FIG. 1).

The irradiation S20 and heating S30 steps are performed simultaneously.

The irradiation step S20 comprises irradiation of the magnetic structure 100 by low-energy light ions of low current.

During this ion irradiation step S20, ions are emitted in an ion beam which uniformly bathes the magnetic structure 100 (FIG. 2).

The ions are emitted in a low dose of between $1*10^{13}$ ions/cm$^2$ and $5*10^{16}$ ions/cm$^2$ and at a low current of less than 10 µA to avoid heating the magnetic structure 100.

The emitted ions then pass through the magnetic stack 110 and are implanted deep in the substrate 104, for example at a depth in the substrate of between 100 nm and 300 nm. The emitted ions are not used for a stack surface treatment. The emitted ions are also not implanted in the irradiated magnetic layer as they are when treating thick magnetic stacks. In the invention, the emitted ions pass through the magnetic layers of the stack where they locally alter the structure by creating inter-atomic displacements, and are implanted deep in the substrate 104 on which the stack of layers was deposited.

The ions used for the irradiation have an energy of between 0.1 keV and 150 keV.

In the example described here, the ions are He ions.

Alternatively, the ions are $H^{30}$ ions or $Ar^+$, $Xe^+$, $Ga^+$ ions.

The ion irradiation step S20 therefore does not result in adding material to the magnetic layers, unlike what occurs in ion implantation processes commonly used in the semiconductor industry.

Instead, the ion irradiation step S20 generates structural alterations in the irradiated layers. As the magnetic properties of the materials are related to their atomic structure, ion irradiation makes it possible to have very fine control of the magnetic properties.

Figure 6:
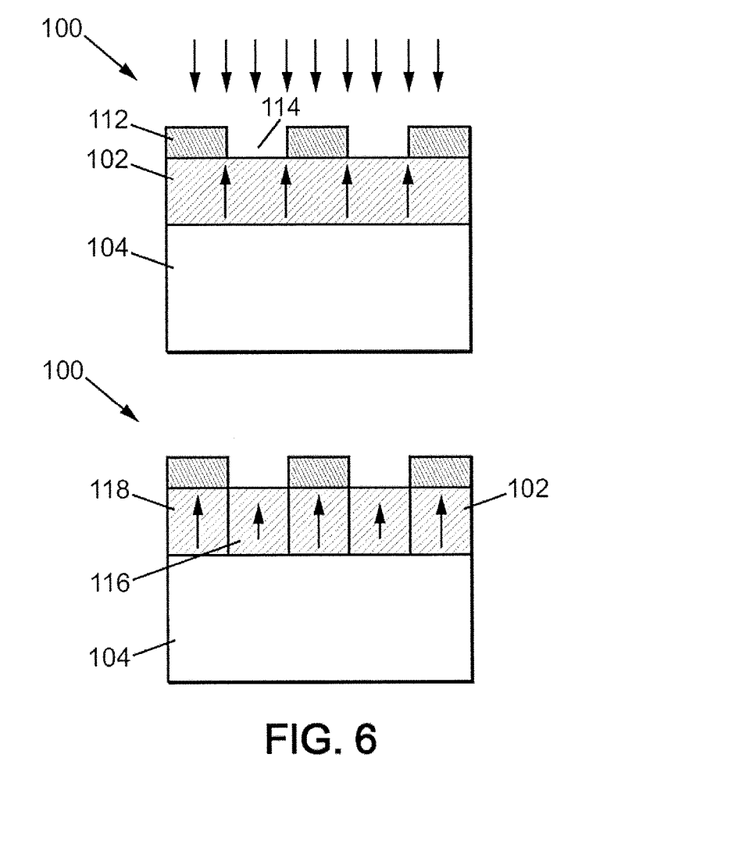
FIGS. 6, 7, 8, 9, and 10 are views similar to the view of FIG. 2 but illustrating different embodiments of the process of FIG. 1.

The irradiation step S20 can be performed through a mask 112 with through-openings 114, as shown in FIG. 6.

Simultaneously with the ion irradiation step S20, the magnetic structure 100 is held at a preset temperature profile and for a preset time.

The preset temperature is less than or equal to 200° C., preferably less than or equal to 100° C.

The preset time is less than or equal to 1 hour, preferably less than or equal to 30 min, and more preferably less than or equal to 10 min.

The heating step S30 combined with the irradiation step is conducive to relaxation of the material to a state of homogeneous equilibrium by facilitating atom mobility.

Various embodiments of the treatment process according to the invention are described below for the case of a magnetic structure 100 comprising a magnetic layer 102 as described in FIG. 2. The direction of magnetization of the magnetic layer is indicated by an arrow.

In a first embodiment of the treatment process according to the invention, the process allows varying, in particular decreasing, the magnitude of the anisotropy of the magnetic layer 102.

The anisotropy of a magnetic layer is a quantity that defines and quantifies the preferred directions of magnetization in the magnetic layer.

In materials based on ultra-thin magnetic multilayers, the properties are dominated by the competition between interface effects and volume properties. For example, the direction of magnetization is given by the sign of an anisotropy coefficient $K_{eff}$, which in CoFeB is given as a first approximation by $K_{eff} = -K_d + (K_{S1}+K_{S2})/t_{CoFeB}$. The first term $K_d$ represents the dipole anisotropy of the form (positive $K_d$), the second term $K_{S1}+K_{S2}$ represents the influence of the interfaces ($K_{S1}$ and $K_{S2}$ represent the anisotropy coefficients at the two interfaces of the CoFeB film). This last term $K_{S1}+K_{S2}$ is inversely proportional to the thickness $t_{COFEB}$ of the CoFeB. Depending on the sign of the anisotropy coefficient $K_{eff}$, the easy axis of magnetization of the film may be perpendicular to the film plane (positive $K_{eff}$) or within the plane of the film (negative $K_{eff}$). We define the effective anisotropy field $H_{eff}=2K_{eff}/M_s$, where $M_s$ is the magnetization of the film. This field can be measured by applying a magnetic field along the hard axis of magnetization, or along an intermediate axis.

In this first embodiment, the magnetic layer 102 is initially crystalline and has a strong perpendicular magnetic anisotropy (magnetization perpendicular to the plane of the layers). For example, the effective anisotropy field is between 300 mT and 400 mT.

The magnetic structure 100 is then irradiated with low-energy light ions and at an ambient temperature of between 15° C. and 40° C.

The magnetic layer 102 remains crystalline but its perpendicular magnetic anisotropy decreases. For example, the effective anisotropy field is between 0 and 300 mT.

As represented in FIG. 6, the irradiation step S20 may also be performed through a mask 112. This results in a magnetic structure 100 of mixed anisotropy, meaning with portions 116 of less perpendicular magnetization corresponding to the portions of the structure located under the openings 114 in the mask 112, and with portions 118 of strong perpendicular magnetization corresponding to the other portions of the structure.

In a second embodiment, the magnetic layer 102 is initially crystalline and has a strong perpendicular magnetic anisotropy. For example, the effective anisotropy field is between 300 mT and 400 mT.

The magnetic structure 100 is then irradiated with low-energy light ions and at an ambient temperature between 15° C. and 40° C., such that the magnetic layer 102 remains crystalline but becomes magnetized in the plane (magnetization in the plane of the layers) with the effective anisotropy field having a magnitude for example between 0 and −200 mT.

Figure 7:
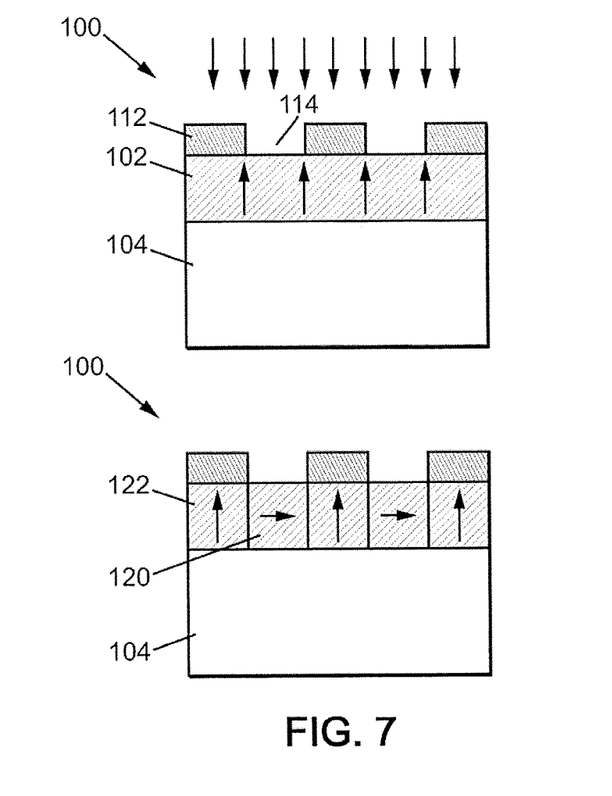

By performing the irradiation step S20 through a mask 112 as represented in FIG. 7, it is also possible to obtain a magnetic structure 100 of mixed anisotropy, meaning with portions 120 of planar magnetization corresponding to the portions of the structure located under the openings 114 in the mask 112, and with portions 122 with strong perpendicular magnetization corresponding to the other portions of the structure.

In a third embodiment, the initially crystalline or amorphous magnetic layer 102 has a low perpendicular magnetic anisotropy. For example, the effective anisotropy field is between 0 and 100 mT.

The magnetic structure 100 is then irradiated with low-energy light ions and simultaneously heated to a temperature higher than the ambient temperature, at least above 20° C., for example above 50° C.

The magnetic layer 102 remains crystalline if initially crystalline or becomes crystalline if initially amorphous, and the perpendicular anisotropy of this magnetic layer increases. For example, the effective anisotropy field is between 100 mT and 600 mT.

Figure 8:
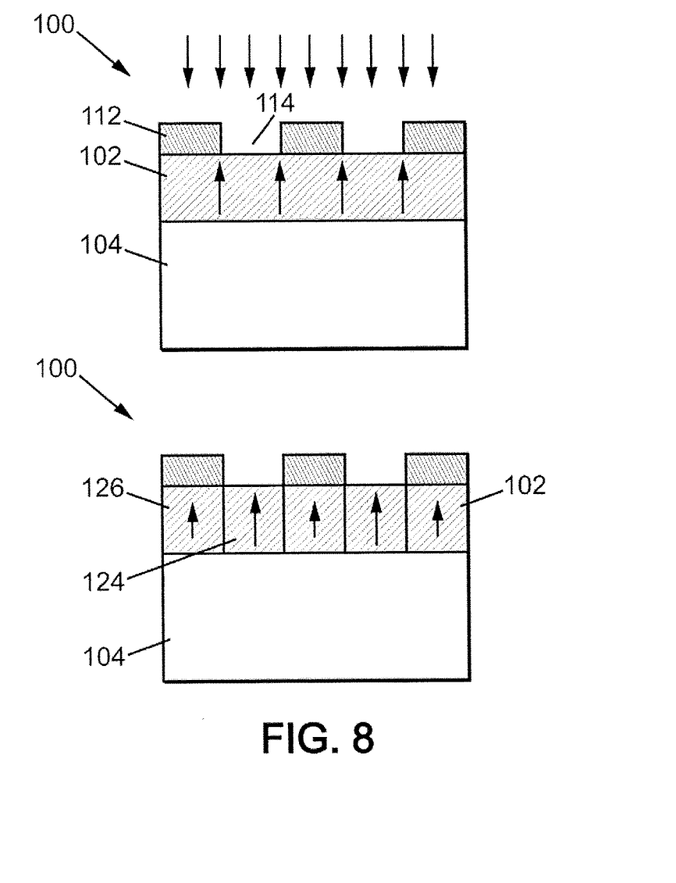

By performing the irradiation step S20 through the mask 112 as represented in FIG. 8, it is possible to obtain a magnetic structure 100 of mixed anisotropy, meaning with portions 124 of strong perpendicular magnetization corresponding to the portions of the structure located under the openings 114 in the mask 112 and with portions 126 of low perpendicular magnetization corresponding to the other portions of the structure.

A perpendicular anisotropy of high magnitude is conducive to high thermal stability, for example for ultra-high density applications. By applying the combined steps S20 and S30 as described above, a perpendicular magnetization of higher magnitude is obtained than by treating the material by thermal annealing at high temperatures in the manner performed currently.

In a fourth embodiment, the initially amorphous magnetic layer 102 has an effective anisotropy field that is planar with a magnitude for example between 0 and −200 mT.

The magnetic structure 100 is then irradiated with low-energy light ions and simultaneously heated to a temperature higher than the ambient temperature, at least above 20° C., for example above 50° C.

The initially amorphous magnetic layer 102 becomes crystalline and the anisotropy of the magnetic layer becomes strongly perpendicular with a magnitude for example between 0 and 600 mT.

Figure 9:
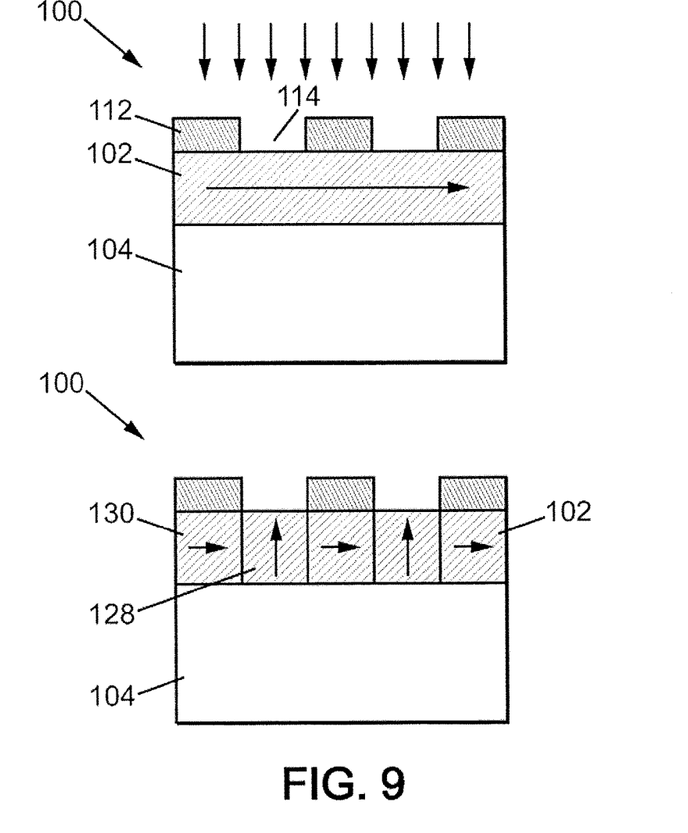

By performing this irradiation step S20 through the mask 112 as shown in FIG. 9, it is possible to obtain a magnetic structure 100 of mixed anisotropy, meaning with portions 128 of strong perpendicular magnetization corresponding to the portions of the structure located below the openings 114 in the mask 112, and with portions 130 of planar magnetization corresponding to the other portions of the structure.

In a fifth embodiment, the magnetic layer 102 is initially crystalline and has a strong perpendicular magnetic anisotropy. For example, the effective anisotropy field is between 300 mT and 400 mT.

The magnetic structure 100 is then irradiated with low-energy light ions and at an ambient temperature between 15° C. and 40° C., such that the magnetic layer is completely mixed with the adjacent layers and thus becomes non-magnetic.

Figure 10:
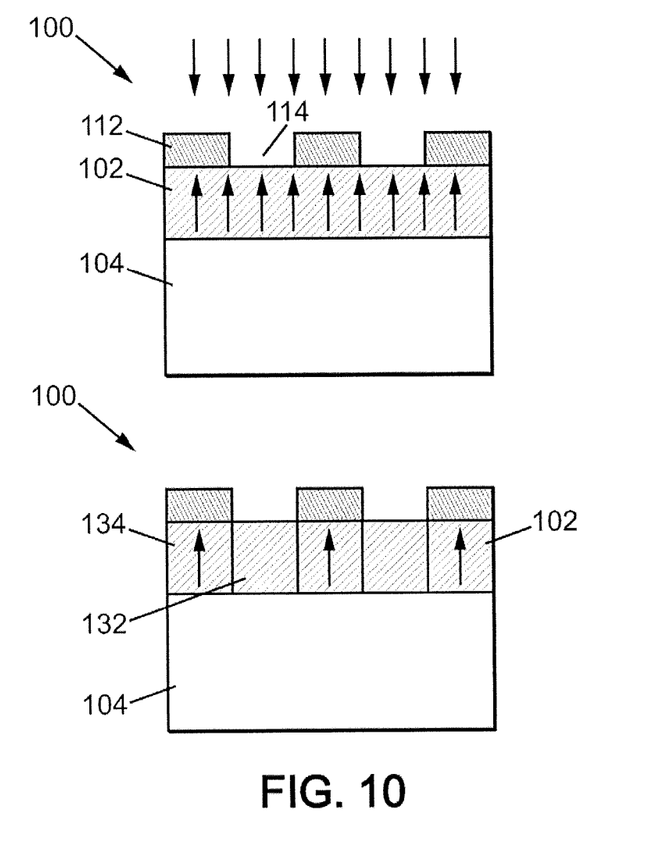

By performing this irradiation step S20 through the mask 112 as shown in FIG. 10, it is possible to obtain a magnetic structure 100 of mixed anisotropy, meaning with non-magnetic portions 132 corresponding to the portions of the structure located under the openings 114 in the mask 112, and with portions 134 of strongly perpendicular magnetization corresponding to the other portions of the structure.

The initially crystalline magnetic layer 102 described in the first and second embodiments of the process of the invention may be the one obtained after treatment by the process according to the third and fourth embodiments of the invention described above, or by thermal annealing at a temperature greater than or equal to 300° C. for 1 to 2 hours.

It is thus possible to use a mask during irradiation to obtain different patterns of magnetic structures within the magnetic layer 102, by means of different masks which differ from one another in the number, shape, dimensions, and positions of the openings 114. One can thus achieve nanometric lateral dimensions of patterns that are difficult to achieve via conventional nanostructuring techniques (lithography etc.).

The use of masks enables the creation of nanostructures embedded in continuous layers, corresponding to local variations in the magnetic properties. One possible application of this type of structure is the generation and trapping of domain walls in such structures.

Although the embodiments illustrated in FIGS. 6 to 10, showing cases where an irradiation mask is used, are described as using a magnetic structure 100 comprising a single magnetic layer of type 102, these embodiments are applicable to the variants of the magnetic structure 100 described in FIGS. 3 to 5.

The process of the invention is therefore based on post-deposition use of ion irradiation to treat films of CoFeB-insulator and in particular to improve their structural properties and control their magnetic properties. It is also possible to obtain magnetic properties that alternate through the film by the use of a mask.

The irradiation of magnetic materials by light ions has the following characteristics:
low energy transfer between incident ions and the atoms of the material, providing optimum control of the magnetic properties;
absence of collision cascade, minimizing the creation of defects in the material;
preservation of microstructure and crystallinity of irradiated materials if starting with a crystalline material; and preservation of the surface.

In addition, it is possible to obtain a crystalline phase from an amorphous phase at low temperatures (below 200° C.) and with annealing times well below 1 hour, by coupling the heating with the irradiation by low-energy light ions, which greatly reduces the energy required for the production of these materials.

In addition it is possible to obtain a magnetic material with a perpendicular magnetic anisotropy between 50% and 100% that is higher, in particular greater than or equal to 500 mT, than thermal annealing at 300° C. where the effective anisotropy field is between 300 mT and 400 mT. The perpendicular magnetic anisotropy thus obtained can be greater than or equal to 600 mT.

In the third and fourth embodiments shown in FIGS. 8 and 9, the magnetic structures resulting from the simultaneous steps of irradiation and heating have strong perpendicular anisotropy. Such structures are highly sought after industrially. Indeed, the use of magnetic materials with perpendicular anisotropy allows domain walls of smaller widths within the materials, thus reducing the size of the nanostructures, and would potentially improve performance and reduce critical parameters such the spin transfer current that must be applied to move a domain wall within a magnetic nanostructure integrated in a magnetic memory.

One can then consider an industrial use of thicker CoFeB films (up to 2 nm instead of the thicknesses between 1.2 nm and 1.5 nm to which we are usually limited) that retain their perpendicular magnetic anisotropy and provide higher magnetoresistance signal values, a crucial step forward.

The main areas of application envisaged concern MRAM magnetic memories and the manufacture of read heads for hard drives.

The invention can be applied to multilayer structures in which the layers are continuous or nanostructured.

The invention claimed is:

1. A process for treating a magnetic structure, wherein it comprises the following steps:
   providing a magnetic structure comprising a stack of magnetic layers, at least one first layer of magnetic material comprising a CoFeB alloy being deposited on a substrate to form part of the stack;
   irradiating the magnetic structure with He+, H+, Ar+, Xe+, or Ga+ ions, which are emitted ions passing through the magnetic layers of the stack where they locally alter the structure by creating inter-atomic displacements, and are implanted deep in the substrate on which the stack was deposited, at a depth in the substrate between 100 nm and 300 nm; and
   simultaneously holding the magnetic structure at a preset temperature profile and for a preset time.

2. The process according to claim 1, wherein the preset temperature is between 20° C. and 200° C.

3. The process according to claim 1, wherein the preset temperature is between 15° C. and 40° C.

4. The process according to claim 1, wherein the preset dine is less than or equal to 1 hour.

5. The process according to claim 1, wherein the magnetic material is initially amorphous.

6. The process according to claim 1, wherein the magnetic material is initially crystalline.

7. The process according to claim 1 wherein the ions have an energy of between 0.1 keV and 150 keV.

8. The process according to claim 1, wherein, during the irradiation step, the ions are emitted at a dose of between $1\times10^{13}$ ions/cm$^2$ and $5\times10^{16}$ ions/cm$^2$.

9. The process according to claim 1, wherein, during the irradiation step, the ions bombard the magnetic structure via through-openings in a mask.

10. The process according to claim 1, wherein the magnetic structure comprises at least one second layer of insulation in contact with the first layer of magnetic material.

11. The process according to claim 10, wherein the magnetic structure comprises a stack of alternating first layers of magnetic material and second layers of insulation.

* * * * *